United States Patent
Kamal et al.

(10) Patent No.: US 6,872,609 B1
(45) Date of Patent: Mar. 29, 2005

(54) NARROW BITLINE USING SAFIER FOR MIRRORBIT

(75) Inventors: Tazrien Kamal, San Jose, CA (US); Weidong Qian, Sunnyvale, CA (US); Kouros Ghandehari, Santa Clara, CA (US); Taraneh Jamali-Beh, Santa Cruz, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 3 days.

(21) Appl. No.: 10/755,430

(22) Filed: Jan. 12, 2004

(51) Int. Cl.$^7$ ............................................. H01L 21/337
(52) U.S. Cl. ...................................... 438/194; 438/526
(58) Field of Search ....................... 438/73, 163, 184, 438/194, 526, 531, 552

(56) References Cited

U.S. PATENT DOCUMENTS

| | | |
|---|---|---|
| 6,215,148 B1 | 4/2001 | Eltan |
| 6,383,952 B1 | 5/2002 | Subramanian et al. |
| 6,410,388 B1 | 6/2002 | Kluth et al. |
| 6,436,768 B1 | 8/2002 | Yang et al. |
| 6,440,797 B1 | 8/2002 | Wu et al. |
| 6,465,303 B1 | 10/2002 | Ramsbey et al. |
| 6,477,084 B1 | 11/2002 | Eitan |
| 6,479,348 B1 | 11/2002 | Kamal et al. |
| 6,492,670 B1 | 12/2002 | Yu |
| 6,524,913 B1 | 2/2003 | Lin et al. |
| 6,566,194 B1 | 5/2003 | Ramsbey et al. |
| 6,573,140 B1 | 6/2003 | Ogura et al. |
| 6,590,811 B1 | 7/2003 | Hamilton et al. |
| 6,617,215 B1 | 9/2003 | Halliyal et al. |
| 6,620,717 B1 | 9/2003 | Kamal et al. |
| 6,630,384 B1 | 10/2003 | Sun et al. |
| 6,632,590 B1 * | 10/2003 | Tzu et al. .................... 430/311 |
| 6,642,148 B1 * | 11/2003 | Ghandehari et al. ........ 438/694 |
| 6,653,190 B1 | 11/2003 | Yang et al. |
| 6,764,946 B1 * | 7/2004 | Amblard ..................... 438/637 |

OTHER PUBLICATIONS

Solid State Technology's WaferNEWS, The Semiconductor Equipment and Materials Weekly Briefing, Mar. 17, 2003, V10n22, 11 pgs.

* cited by examiner

*Primary Examiner*—Matthew Smith
*Assistant Examiner*—Calvin Lee (57) ABSTRACT

A technique for forming at least part of an array of a dual bit memory core is disclosed. A Safier material is utilized in the formation process to reduce the size of buried bitlines in the memory, which is suitable for use in storing data for computers and the like. The smaller (e.g., narrower) bitlines facilitate increased packing densities while maintaining an effective channel length between the bitlines. The separation between the bitlines allows dual bits that are stored above the channel within a charge trapping layer to remain sufficiently separated so as to not interfere with one another. In this manner, one bit can be operated on (e.g., for read, write or erase operations) without substantially or adversely affecting the other bit. Additionally, bit separation is preserved and leakage currents, cross talk, as well as other adverse effects that can result from narrow channels are mitigated, and the memory device is allowed to operate as desired.

27 Claims, 8 Drawing Sheets

Fig. 1

(PRIOR ART)

Fig. 2

(PRIOR ART)

NARROW BITLINE USING SAFIER FOR MIRRORBIT

RELATED APPLICATIONS

This application is related to U.S. patent application Ser. No. 10/729,732, filed on Dec. 5, 2003, entitled "HARD MASK SPACER FOR SUBLITHOGRAPHIC BITLINE."

FIELD OF INVENTION

The present invention relates generally to memory for computer systems and the like, and in particular to a technique for forming narrower bitline openings and correspondingly narrower buried bitlines in such memory to increase packing density of the memory.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

Flash memory is generally constructed of many memory cells where single bits of data are stored in and read from respective memory cells. The cells are generally programmed by hot electron injection and erased by Fowler-Nordheim tunneling. As with many aspects of the semiconductor industry, there is a continuing desire to scale down device dimensions to achieve higher device packing densities on semiconductor wafers. Similarly, increased device speed and performance are also desired to allow more data to be stored on smaller memory devices. Accordingly, there are ongoing efforts to, among other things, increase the number of memory cells that can be packed on a semiconductor wafer.

Individual memory cells are organized into individually addressable units or groups, which are accessed for read, program, or erase operations through address decoding circuitry. The individual memory cells are typically comprised of a semiconductor structure adapted for storing a bit of data. For instance, many conventional memory cells include a stacked gate metal oxide semiconductor (MOS) device, such as a transistor in which a binary piece of information may be retained. The memory device includes appropriate decoding and group selection circuitry, as well as circuitry to provide voltages to the cells being operated on.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

The memory cell generally has a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

In a NOR configuration, the control gate is connected to a wordline associated with a row of memory cells to form sectors of such cells. In addition, the drain regions of the cells are connected together by a conductive bitline. The channel of the cell conducts current between the source and the drain in accordance with an electric field developed in the channel by the stacked gate structure. Respective drain terminals of the transistors within a single column are connected to the same bitline. In addition, respective flash cells associated with a given bitline have stacked gate terminals coupled to a different wordline, while all the flash cells in the array generally have their source terminals coupled to a common source terminal. In operation, individual flash cells are addressed via the respective bitline and wordline using the peripheral decoder and control circuitry for programming (writing), reading or erasing functions.

By way of further detail, the single bit stacked gate flash memory cell is programmed by applying a relatively high voltage to the control gate and connecting the source to ground and the drain to a predetermined potential above the source. A resulting high electric field across the tunnel oxide leads to the Fowler-Nordheim tunneling phenomena. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a read operation, a certain voltage bias is applied across the drain to source of the cell transistor. The drain of the cell is the bitline, which may be connected to the drains of other cells in a byte or word group. The voltage at the drain in conventional stacked gate memory cells is typically provided at between 0.5 and 1.0 volts in a read operation. A voltage is then applied to the gate (e.g., the wordline) of the memory cell transistor in order to cause a current to flow from the drain to source. The read operation gate voltage is typically applied at a level between a programmed threshold voltage ($V_T$) and an unprogrammed threshold voltage. The resulting current is measured, by which a determination is made as to the data value stored in the cell.

A very modern memory technology is dual bit memory, which allows multiple bits to be stored in a single cell. In this technology, a memory cell is essentially split into two identical (mirrored) parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the storing of two bits.

In a virtual ground type architecture, dual bit memory cells have a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

As device sizes and features are continually scaled down, however, leakage currents, cross talk and other issues can arise. Limitations in photoresists and other materials and/or techniques utilized in patterning the semiconductor substrate as well as other materials out of which the memory cells are fashioned can, for example, limit the size to which some features, such as wordlines and/or bitlines, can be reduced. One technique to pack more cells into a smaller area is to form the structures closer together. Forming bitlines, for example, closer together shortens the length of the channel defined therebetween. Shortening the channel in such a manner can, however, lead to leakage currents as well as other undesirable performance issues. For example, charge or bit isolation between the two bits stored in the charge trapping layer becomes increasingly difficult as the channel length is decreased and the bits are brought closer together. In this manner, cross-talk can occur, the bits can contaminate one another and operations performed on one bit can affect the other bit (sometimes referred to complimentary bit disturb or CBD). Accordingly, it would be desirable to reduce feature sized so as to increase packing density while mitigating the adverse affects that may result therefrom.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention pertains to utilizing Safier to reduce the size of bitlines in fashioning a dual bit memory device thereby allowing for increased packing density while maintaining an effective length of a channel defined between the bitlines. In this manner, bit separation is preserved and leakage currents, cross talk, as well as other adverse effects that can result from narrow channels are mitigated allowing the memory device to operate as desired.

According to one or more aspects of the present invention, a method of forming at least a portion of a dual bit memory core array upon a semiconductor substrate is disclosed. The method includes forming a portion of a charge trapping dielectric layer over the substrate and forming a resist over the portion of the charge trapping dielectric layer. The method also includes patterning the resist to form a plurality of resist features having respective first spacings therebetween. A Safier material is then applied to sidewalls of the resist features, and is treated so that it becomes attached to sidewalls of the resist features and defines respective second spacings between the resist features that are less than the first spacings. A bitline implant is then performed through the second spacings and the portion of the charge trapping dielectric layer to establish buried bitlines within the substrate having respective widths corresponding generally to that of the second spacings. The patterned resist and Safier material are then removed, and the remainder of the charge trapping dielectric layer is formed over the portion of the charge trapping dielectric layer. A wordline material is then formed over the remainder of the charge trapping dielectric layer, and is patterned to form wordlines that overlie the bitlines.

In accordance with one or more other aspects of the present invention a method of forming at least a portion of a dual bit memory core array upon a semiconductor substrate is disclosed. The method includes utilizing a Safier material to narrow bitline openings defined between resist features formed upon a charge trapping layer overlying a first insulating layer overlying the substrate. The method also includes forming bitline implants through the openings, charge trapping layer and first insulating layer to establish buried bitlines within the substrate having respective widths corresponding generally to widths of the narrowed bitline openings. The method further includes removing the resist features and Safier material, forming a second insulating layer over the charge trapping layer, forming a wordline material over the second insulating layer and patterning the wordline material to form wordlines that overlie the bitlines.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The present invention pertains to utilizing a Safier material to reduce the size of buried bitlines in dual bit flash memory suitable for use in storing data for computers and like devices. The smaller (e.g., more narrow) bitlines facilitate increased packing densities while maintaining an effective channel length between the bitlines. The separation between the bitlines allows for two bits that are stored above the channel within a charge trapping layer to remain separate and apart so as to not interfere with one another. In this manner, one bit can be operated upon (e.g., programmed, erased or read) without affecting the other bit. Additionally, bit separation is preserved and leakage currents, cross talk, as well as other adverse effects that can result from narrow channels are mitigated, and the memory device is allowed to operate as desired.

Figure 1:
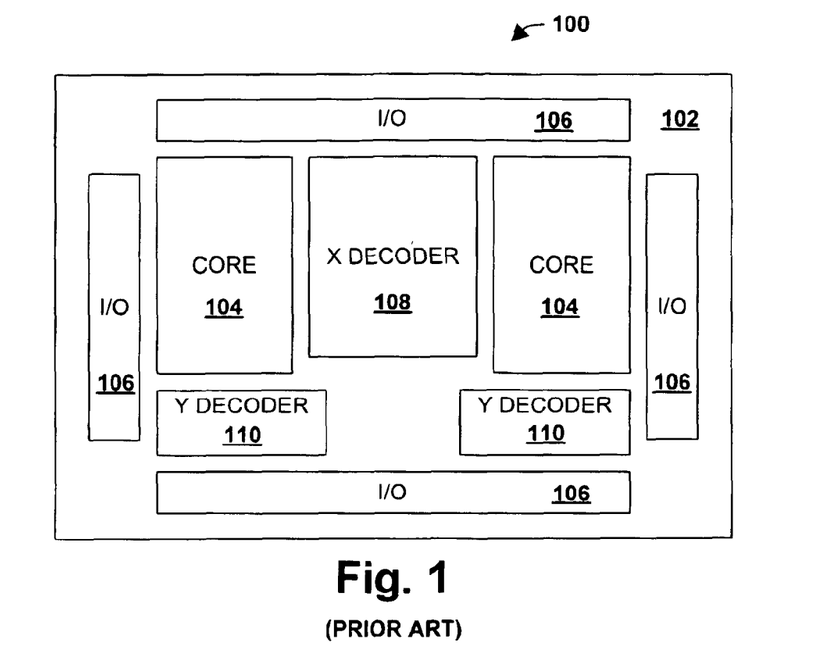
FIG. 1 is a top view of a dual bit flash memory device.

Referring initially to FIG. 1, a top view of an exemplary dual bit flash EEPROM 100 is illustrated. The memory 100 generally includes a semiconductor substrate 102 in which one or more high-density core regions 104 and one or more lower-density peripheral portions are formed. The high-density core regions typically include one or more M by N arrays 104 of individually addressable, substantially identical dual bit flash memory cells. The lower-density peripheral portions on the other hand typically include input/output (I/O) circuitry 106 and programming circuitry for selectively addressing the individual memory cells. The programming circuitry is represented in part by and includes one or more x-decoders 108 and one or more y-decoders 110 that cooperate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
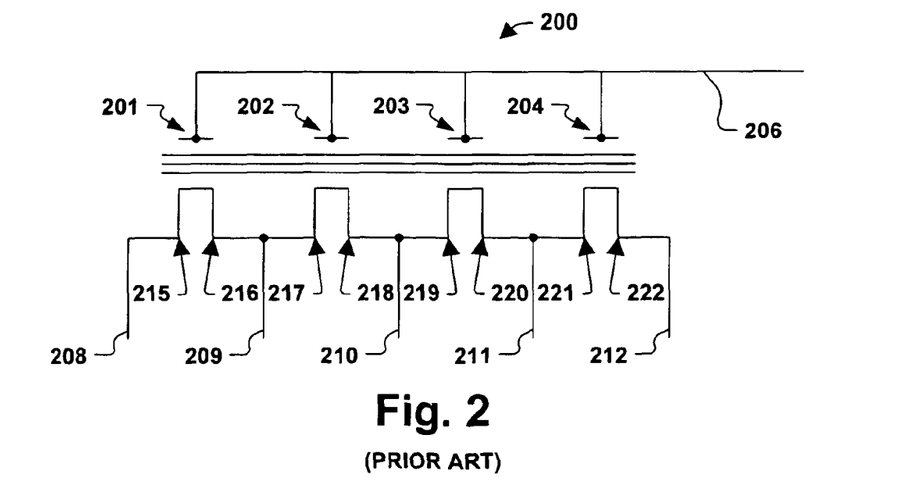
FIG. 2 is a schematic illustration of a portion of a memory core such as may include at least part of one of the cores depicted in FIG. 1 in a virtual ground type configuration.

Turning to FIG. 2, a schematic illustration is presented of a portion 200 of a memory core such as may include at least part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a wordline 206, which serves as a control gate, and pairs of the memory cells share a common bitline. For instance, in the example shown, the memory cell 201 has associated bitlines 208 and 209; the memory cell 202 has associated bitlines 209 and 210; the memory cell 203 has associated bitlines 210 and 211; and the memory cell 204 has associated bitlines 211 and 212. As such, cells 201 and 202 share bitline 209, cells 202 and 203 share bitline 210 and cells 203 and 204 share bitline 211, respectively.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. It will be appreciated that although adjacent memory cells share common bitlines, the adjacent memory cells do not interfere with each other because the memory cells are typically programmed one at a time and in such instances only one memory cell is active at a time while programming.

Figure 3:
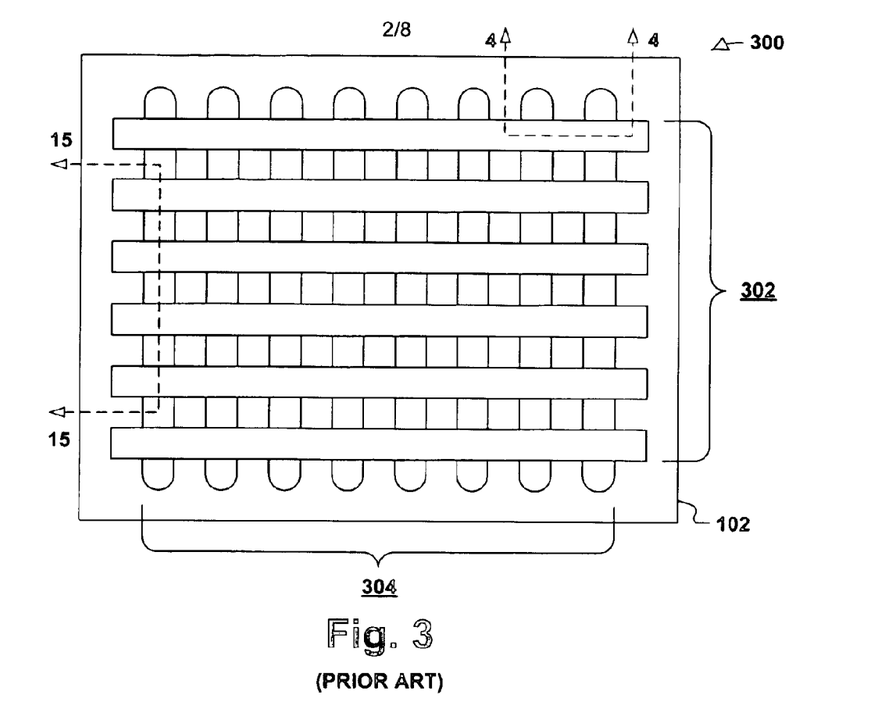
FIG. 3 is a top view of at least a portion of a memory core, such as may include at least part of one of the cores depicted in FIG. 1.

Referring now to FIG. 3, a top view is presented of at least a portion 300 of a memory core, such as may include at least part of one of the M by N array cores 104 depicted in FIG. 1. The memory 300 is formed upon a semiconductor substrate 102 and has a plurality of implanted bitlines 304 extending substantially parallel to one another, and further includes a plurality of formed wordlines 302 extending substantially in parallel to one another and at substantially right angles to the plurality of implanted bitlines 304. It will be appreciated that the wordlines 302 and bitlines 304 have contacts and interconnections (not shown) to programming circuitry such as may be represented, at least in part, by the x-decoders 108 and y-decoders 110 depicted in FIG. 1.

Figure 4:
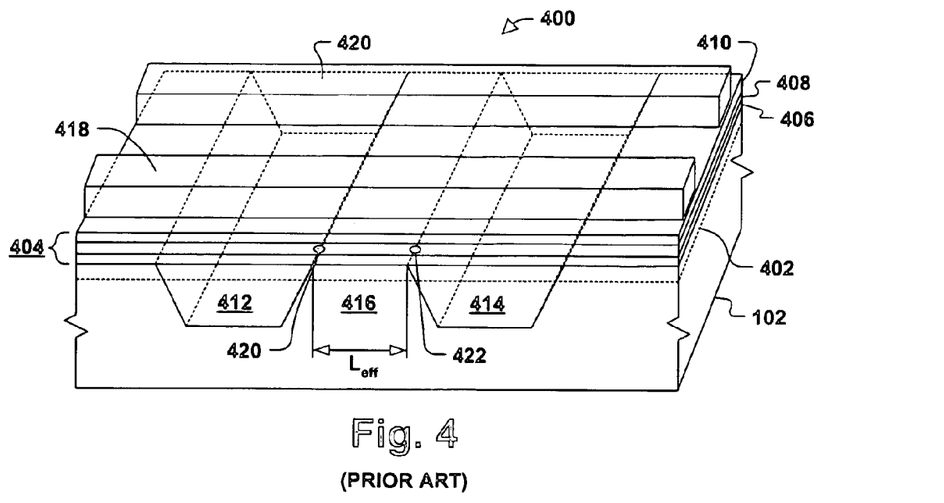
FIG. 4 is a cross-sectional isometric illustration of a portion of a dual bit flash memory, such as that taken along line 4—4 of FIG. 3.

FIG. 4 is a cross-sectional isometric illustration of a portion 400 of a dual bit flash memory, such as that taken along line 4—4 of FIG. 3. A semiconductor substrate 102 upon which the memory is formed is doped with a p-type impurity such as boron, for example, to establish a threshold adjustment implant ($V_{tadjust}$) region 402 therein. The threshold adjustment implant provides a region 402 that is more heavily doped than the semiconductor substrate 102. The substrate can, for example, be formed out of silicon and can itself be doped with a p-type impurity. The threshold adjustment implant 402 assists in controlling a threshold voltage of the various cells within the memory 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are typically formed of an oxide dielectric such as silicon dioxide ($SiO_2$) and the charge-trapping layer 408 is generally formed of a nitride dielectric such as silicon nitride ($Si_xN_y$). The oxide-nitride-oxide configuration is commonly referred to as an ONO layer for convenience. Alternatively, other types of charge-trapping layers may be employed and are contemplated as falling within the scope of the present invention.

First and second conductive bitlines 412 and 414 are depicted in FIG. 4 underlying the charge trapping dielectric layer 404. It will be appreciated that any number of such bitlines can be implanted into the semiconductor substrate 102, and that such bitlines may correspond to the bitlines 304 depicted in FIG. 3. The bitlines are typically formed of an implanted n-type material, such as arsenic, and may include an oxide portion (not shown) in some examples. The first and second conductive bitlines 412 and 414 are spaced apart and define a channel region 416 there-between.

First and second conductive wordlines 418, 420 are similarly depicted overlying the charge-trapping dielectric layer 404. It will be appreciated that any number of such wordlines can be formed over the dielectric layer 404, and that such wordlines may correspond to the wordlines 302 depicted in FIG. 3. The wordlines can be formed out of a polysilicon material, for example, where the polysilicon material may be deposited over the dielectric layer 404 and then patterned and etched.

Locations 420 and 422 indicate generally where respective bits of data can be stored in one or the cells of the memory 400. It will be appreciated that the channel 416 has an effective length $L_{eff}$ and that the bits 420, 422 will be brought closer together as this length is reduced (e.g., as a result of scaling). As such, the bits themselves may interfere with and/or contaminate one another and operations performed on one bit may affect the other bit should the bits get too close to one another. Accordingly, the degree to which the memory can be scaled via channel length reduction in some cases is limited and a technique for reducing the size of the device without reducing the channel length (e.g., below some effective length $L_{eff}$) would be desirable.

Figure 5:
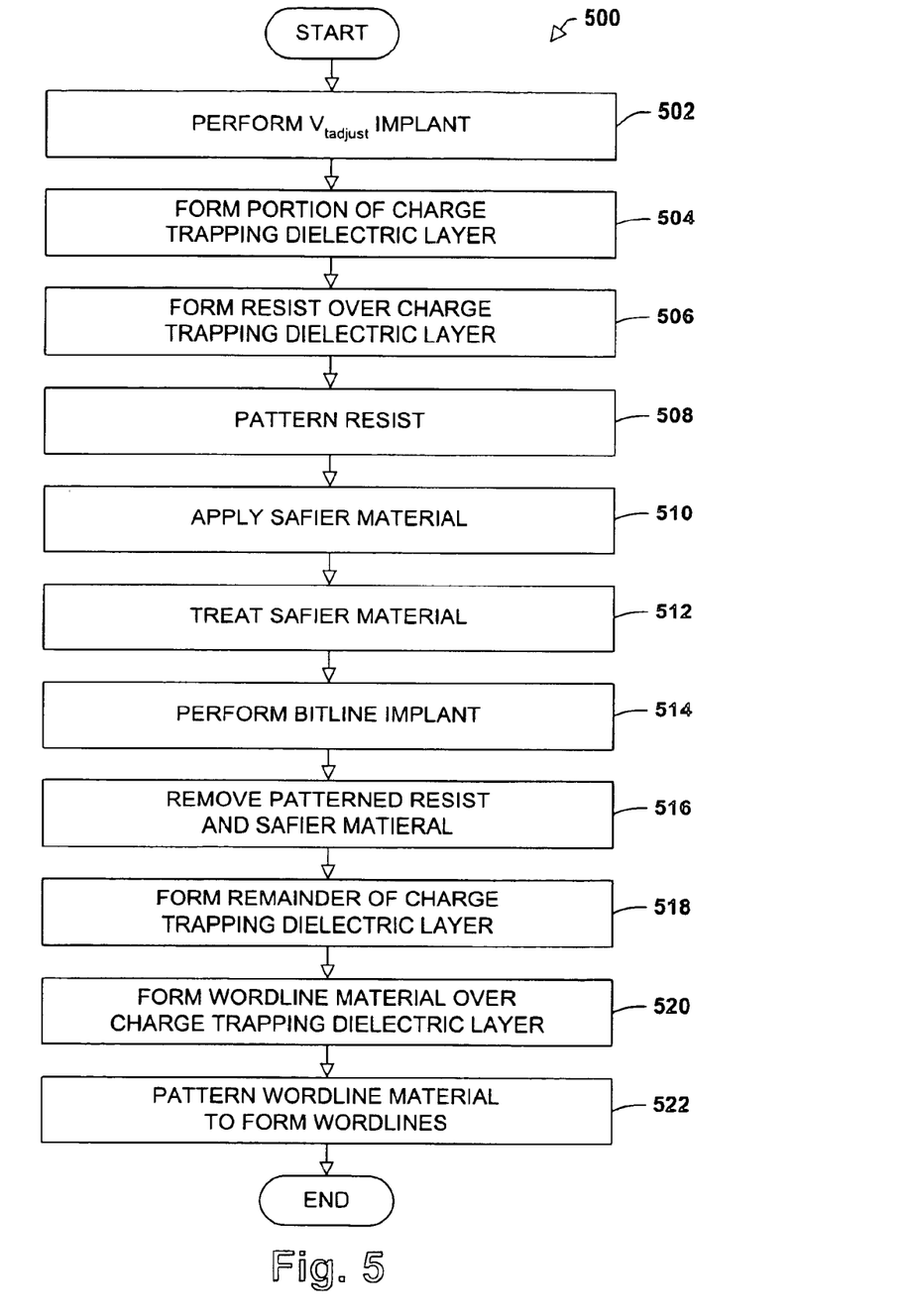
FIG. 5 is a flow diagram illustrating an example of a methodology for forming a memory device in accordance with one or more aspects of the present invention wherein bitline sizes are reduced via the use of Safier, thereby providing for increased packing density.

Turning to FIG. 5, a methodology 500 is illustrated for forming a memory device according to one or more aspects of the present invention. In particular, the memory is formed so as to facilitate scaling via bitline width reduction which was heretofore not capable due to limitations associated with resists and/or other patterning materials, techniques or lithography tools. The memory device so formed may, for example, correspond to a portion of a memory core such as may include at least part of one of the M by N array cores depicted in FIG. 1.

Although the methodology 500 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a dual bit memory as illustrated and described below with respect to FIGS. 6–15, as well as to devices not shown or described herein.

The memory is formed upon a semiconductor substrate and at 502 a threshold adjustment implant $V_{adjust}$ is performed to establish a region of the substrate that is more heavily doped than the remainder of the semiconductor substrate. The substrate can, for example, be formed out of silicon and can itself be doped with a p-type impurity such as boron, for example. The threshold adjustment implant may include a greater concentration of and/or a higher energy implant of the same or different p-type dopant utilized in the rest of the substrate, for example, and assists in controlling a threshold voltage of the memory.

At 504 a portion of a charge trapping dielectric layer is formed over the semiconductor substrate. This portion of a charge trapping dielectric layer includes a first insulating layer and a charge trapping layer. The first insulating layer may be formed of an oxide dielectric such as silicon dioxide ($SiO_2$), for example, and the charge trapping layer may be formed of a nitride dielectric such as silicon nitride ($Si_xN_y$), for example. The first insulating layer can be formed to a thickness of about 70 Angstroms or less, for example, while the charge trapping layer can be formed to a thickness between about 60 to 80 Angstroms.

A layer of resist material is then formed over the charge trapping dielectric layer at 506. The resist is a radiation-sensitive film of material that can be applied to a thickness of between about 2000 to 5000 Angstroms, for example, and fixed onto the charge trapping dielectric layer (e.g., via baking). The resist is then patterned at 508. In particular, an exposing source (e.g., light, x-rays, an electron beam) can be utilized to illuminate selected areas of the surface of the film through an intervening master template (e.g., a mask or reticle) to transfer a pattern formed within the template onto resist.

More particularly, light projected onto the resist layer during photolithography changes properties (e.g., solubility) of the layer of material such that different portions thereof (e.g., the illuminated or un-illuminated portions, depending upon the type of resist utilized) can be manipulated in subsequent processing steps. For example, regions of a negative resist become insoluble when illuminated by an exposure source such that the application of a solvent to the resist during a subsequent development stage removes only non-illuminated regions of the resist. The pattern formed in the negative resist layer is, thus, the negative of the pattern defined by opaque regions of the template. By contrast, in a positive resist, illuminated regions of the resist become soluble and are removed via application of a solvent during development. Thus, the pattern formed in the positive resist is a positive image of opaque regions on the template.

The lithographic coating is thus a radiation-sensitized coating suitable for receiving a projected image of the subject pattern. Once the image from the intervening master template is projected onto the resist, it is indelibly formed therein. An optional antireflective coating (ARC) (e.g., of an organic material, such as silicon nitride or silicon oxynitride) can also be formed along with the resist to mitigate reflection during exposure and thereby improve the fidelity of pattern transfer. A BARC (bottom antireflective coating) etch may then also be performed in the patterning of the resist. Such an etch may utilize an oxygen plasma, for example, since the BARC may be organic. Features formed out of the resist, and more particularly apertures between such features, correspond to bitlines which will be formed within the substrate.

At 510, Safier material is formed adjacent to sidewalls of the resist features. Such Safier material may, for example, be available from Tokyo Ohka Kogyo Co., Ltd. and assists with forming narrower buried bitlines. In particular, the Safier material is treated (e.g., heated) at 512 so as to become affixed to sidewalls of the resist features. By way of example, the Safier material is similar to the resist material and baking the Safier material can, for example, cause the resist and Safier materials to "flow" together such that the Safier material becomes attached to the sidewalls of the resist features. It will be appreciated that this act can be repeated multiple times to iteratively "build out" or thicken the features.

In this manner, the apertures or openings between the resist features are made more narrow. By way of example, such opening can be reduced from around 140 nanometers to around 120 nanometers. Should the process be repeated, the openings can be further reduced to around 90 nanometers and then to around 50 nanometers, for example. Respective lengths of channels defined between pairs of buried bitlines that are implanted through the openings as discussed infra are correspondingly increased as the bitlines are themselves narrowed. As such, packing density can be increased by forming the resist features closer together such that buried bitlines are implanted closer together. An effective channel length ($L_{eff}$) can thus be maintained, where the effective channel length is a channel length at which one bit of a pair of (mirror) bits that are stored within the charge trapping layer above the channel are sufficiently isolated from one another such that the bits do not disturb one another and one bit remains substantially unaffected when the other bit is acted upon (e.g., a read, write or erase operation).

A bitline implant is then performed at 514 to establish the buried bitlines within the semiconductor substrate. The bitline implant can include one or more n-type dopants (e.g., arsenic, phosphorous and/or antimony) and can be performed at a concentration of between about 0.75E15 and 2E15 atoms/cm$^3$ at an energy level of between about 40 to 70 KeV, for example. It will be appreciated, however, that any suitable implant compositions and concentrations are contemplated as falling within the scope of the present invention. The buried bitlines act as respective sources and drains for corresponding memory cells, and respective channels are defined between corresponding pairs of buried bitlines.

The patterned resist and Safier material are then removed (e.g., stripped away) at 516, and the remainder of the charge trapping dielectric layer is formed at 518 (e.g., to a thickness of about 100 Angstroms or less). As with the first insulating layer, this second insulating layer can be formed of an oxide dielectric such as silicon dioxide ($SiO_2$). It will be appreciated that the oxide-nitride-oxide configuration is commonly referred to as an ONO layer for convenience. It will be further appreciated that performing the bitline implant before forming the second insulating layer mitigates damage to the second insulating layer which can adversely affect (e.g., lower) a threshold breakdown voltage ($V_T$). For example, since the second insulating layer may contain oxide based material(s), this layer can become damaged via exposure to plasma during the implant process. A layer of wordline material is then formed over the ONO layer at 520. The wordline material can, for example, include polysilicon. Finally, the wordline material is patterned at 522 to establish wordlines over the buried bitlines (e.g., as depicted in FIGS. 3 and 4). The methodology may then continue on for further back-end processing.

Figure 6:
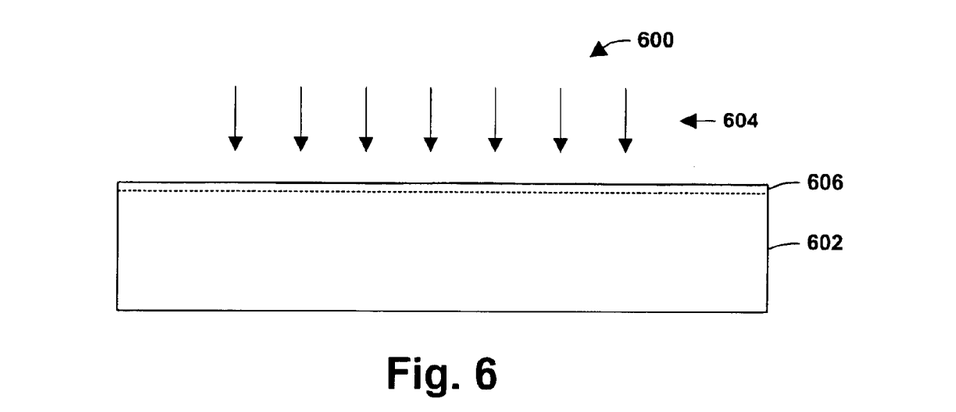
FIGS. 6–15 are cross-sectional illustrations of memory formed according to one or more aspects of the present invention.

Turning now to FIGS. 6–15, an exemplary technique for forming a memory device 600 according to one or more aspects of the present invention is disclosed (FIG. 6). In particular, the memory 600 is formed in a manner that facilitates scaling and resultant enhanced packing density via reducing the size of buried bitlines which was heretofore not feasible due to limitations associated with resists, patterning materials or lithography tools. The memory device 600 so formed may, for example, correspond to a portion of a memory core such as may include at least part of one of the M by N array cores depicted in FIG. 1.

Initially, a semiconductor substrate 602 upon which the memory 600 is formed is subjected to a threshold adjustment implant 604 to establish a region 606 in the core of the substrate 602 that is more heavily doped than the remainder of the semiconductor substrate (FIG. 6). The substrate may itself be doped with a p-type dopant such as boron, for example, and the threshold adjustment implant ($V_{tadjust}$) may include a greater concentration of the same or different p-type dopant, for example. The threshold adjustment implant 606 assists in controlling a threshold voltage of the memory device 600. The threshold adjustment implant, however, is optional and may be skipped in accordance with the present invention.

It is to be appreciated that reference to substrate or semiconductor substrate as used herein can include a base semiconductor wafer (e.g., silicon, SiGe, or an SOI wafer) and any epitaxial layers or other type semiconductor layers formed thereover or associated therewith. It is to be further appreciated that elements depicted herein are illustrated with particular dimensions relative to one another (e.g., layer to layer dimensions and/or orientations) for purposes of simplicity and ease of understanding, and that actual dimensions of the elements may differ substantially from that illustrated herein.

Figure 7:
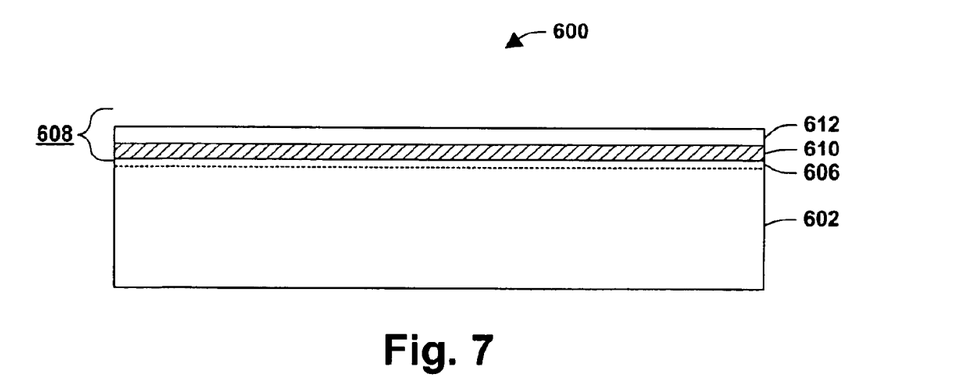
Figure 8:
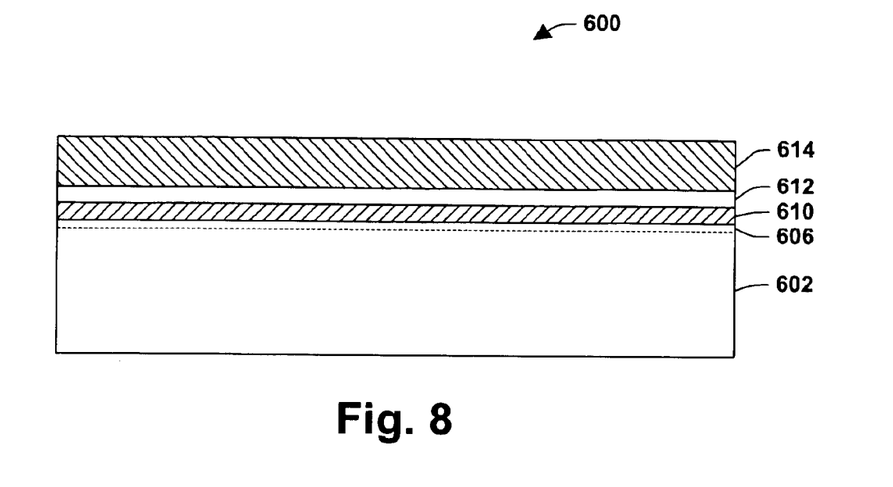

A portion of a charge trapping dielectric layer 608 is then formed over the semiconductor substrate 602 (FIG. 7). This portion of a charge trapping dielectric layer 608 includes a first insulating layer 610 and a charge trapping layer 612. A layer of resist material 614 is then formed over the charge trapping layer 612 (FIG. 8). The resist 614 is a radiation-sensitive film of material that can be applied to a thickness of between about 2000 to 5000 Angstroms, for example, and fixed onto the charge trapping layer 612 (e.g., via baking).

Figure 9:
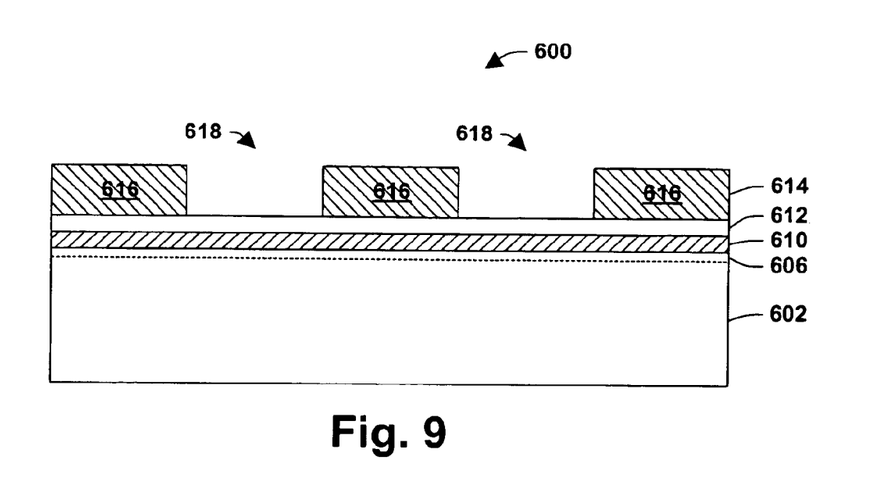

The resist 614 is then patterned, such as by selective exposure to a source of radiation (e.g., light, x-rays, an electron beam) that can be utilized to illuminate particular areas of the film 614 through an intervening master template (e.g., a mask or reticle) to transfer a pattern formed within the template onto resist 614 (FIG. 9). Once the image from the intervening master template (not shown) is projected onto the resist 614, it is indelibly formed therein. Although not shown, an optional antireflective coating (ARC) (e.g., of an organic material, such as silicon nitride or silicon oxynitride) can also be formed along with the resist to mitigate reflection during exposure and thereby improve the fidelity of pattern transfer. A BARC (bottom antireflective coating) etch may then also be performed in the patterning of the resist. Such an etch may utilize an oxygen plasma, for example, since the BARC may be organic. Features 616 formed out of the resist 614, and more particularly apertures 618 between such features 616, correspond to bitlines which will later be formed within the substrate 602.

Figure 10:
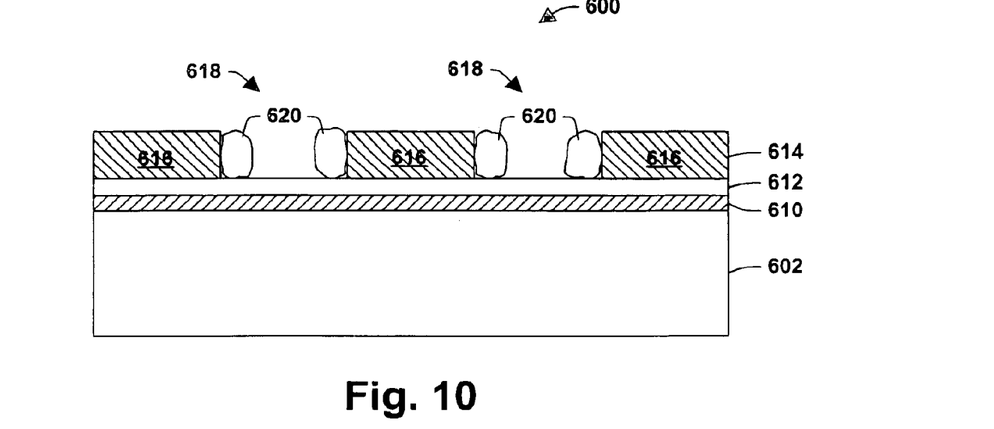
Figure 11:
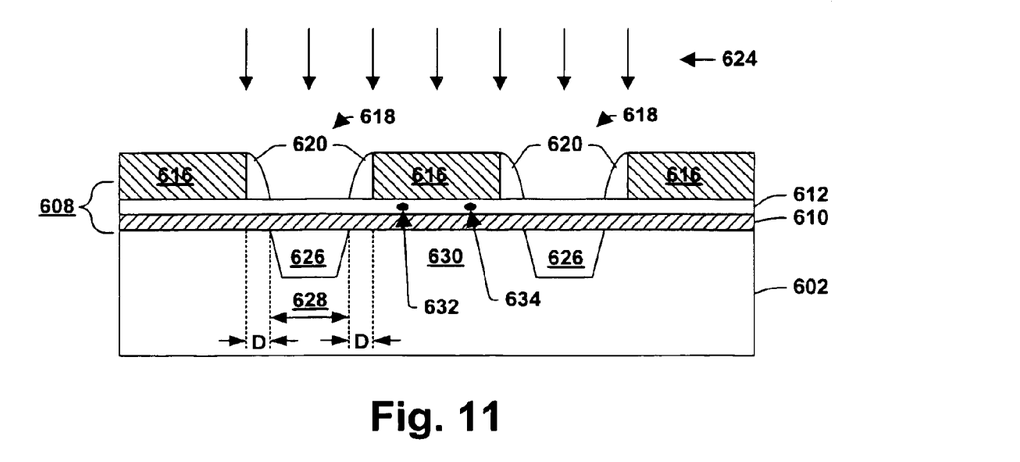

Safier material 620 is then formed adjacent to sidewalls of the resist features 616 (FIG. 10). The Safier material 620 assists with forming narrower buried bitlines. In particular, the Safier material 620 is treated (e.g., heated) so as to become affixed to sidewalls of the resist features 616 (FIG. 11). By way of example, the Safier material 620 is similar to the resist material 614 and baking the Safier material 620 can, for example, cause the resist and Safier materials to "flow" together such that the Safier material 620 becomes attached to the sidewalls of the resist features 616. The Safier material adhered to the sidewalls of the resist features 616 thus narrow the apertures or openings 618 defined between the resist features 616. It will be appreciated that this act can be repeated multiple times to iteratively "build out" or thicken the features 616.

A bitline implant 624 is then performed to establish buried bitlines 626 within the semiconductor substrate 602. The bitline implant 624 can include Arsenic, for example, and can be performed at a concentration of between about 0.75E15 and 2E15 atoms/cm$^3$ at an energy level of between about 40 to 70 KeV, for example. It will be appreciated that the portions 622 of the Safier material inhibit the dopant 624 from being implanted within the semiconductor substrate 602 at locations below the portions 622. Accordingly, the buried bitlines 626 are narrower than conventional bitlines by an amount substantially equal to the width of corresponding portions 622 of Safier material lining an opening 618. For instance, bitlines 626 have a width of 628 in the illustrated example, whereas conventional bitlines, such as bitlines 412 illustrated in FIG. 4, for example, that are formed without utilizing Safier material have an additional width of around 2D or an additional width corresponding to the width of relevant portions 622 of the Safier material. It will be appreciated that this disparity would become incrementally greater should the process be repeated multiple times.

Figure 12:
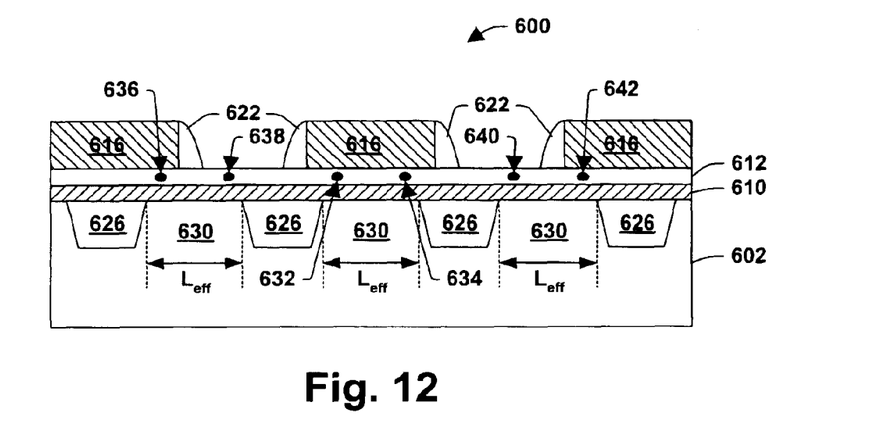

Respective lengths of channels 630 defined between pairs of buried bitlines 626 are correspondingly increased as the bitlines 626 are themselves narrowed. As such, packing density can be increased by forming the resist features closer together such that buried bitlines 626 are implanted closer together (FIG. 12). In this manner, the length of a channel 630 defined between respective sets of bitlines 626 can be maintained at an effective channel length ($L_{eff}$), where the effective channel length is a channel length at which one bit of a pair of (mirror) bits 632, 634 that are stored within the charge trapping layer 612 above the channel 630 are sufficiently isolated from one another such that the bits do not disturb one another and one bit remains substantially unaffected when the other bit is acted upon (e.g., a read, write or erase operation). This allows more bits of information to be stored within the same area of memory, such as bits 632, 634, 636, 638, 640 and 642, for example. As such, more bitlines can be formed within the semiconductor substrate 602 and packing density can thus be enhanced without compromising device performance.

Figure 13:
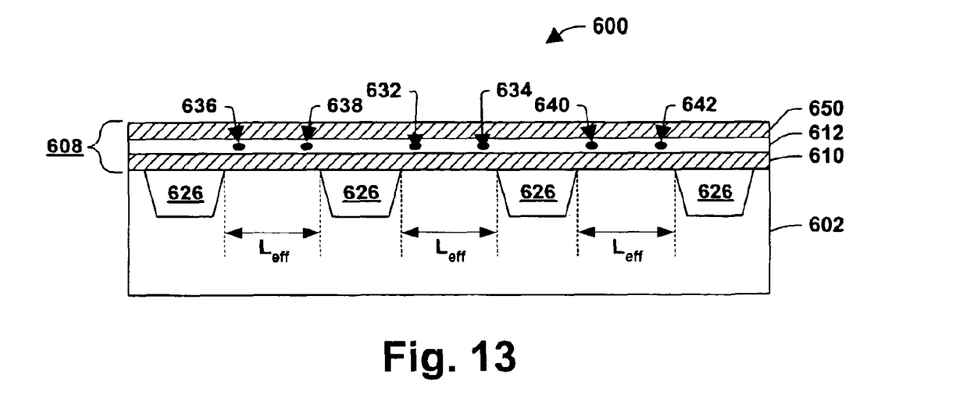

The resist features 616 and portions of Safier material 622 are then removed (e.g., stripped away), and the remainder of the charge trapping dielectric layer 608 is formed over the charge trapping layer 612 (FIG. 13). The remainder of the charge trapping dielectric layer can include a second insulating layer 650, for example. It will be appreciated that the first 610 and second 650 insulating layers of the charge trapping dielectric layer 608 can include one or more oxide based materials, while the charge trapping layer 612 of the charge trapping dielectric layer 608 can include one or more nitride based materials. As such the charge trapping dielectric layer can be referred to as an ONO layer. It will be further appreciated that performing the bitline implant before forming the second insulating layer 650 mitigates damage to the second insulating layer which can adversely affect (e.g., lower) a threshold breakdown voltage ($V_T$). For example, since the second insulating layer 650 may contain oxide based material(s), this layer can become damaged via exposure to plasma during the implant process.

It is also to be appreciated, however, that the charge trapping dielectric layer 608 can be any dielectric layer or layers that are capable of or facilitate electron trapping. In other words, to facilitate electron trapping, the charge trapping dielectric has a layer with a lower barrier height than the layers sandwiching it (e.g., two layers with relatively higher barrier heights sandwiching a layer with a relatively lower barrier height). In the case of an ONO tri-layer dielectric, for example the oxide layers 610, 650 can have a barrier height of about 3.1 eV, for example, whereas the nitride layer 612 can have a barrier height of about 2.1 eV, for example. In this arrangement, a charge trapping well is created in the middle layer 612.

By way of example, charge trapping dielectric layers can include an ONO tri-layer dielectric, an oxide/nitride bilayer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanate/barium strontium titanate trilayer dielectric ($SiO_2/SrTiO_3/BaSrTiO_2$), and the like. An ONO type nonvolatile memory device in accordance with that described herein can contain any charge trapping dielectric layer or layers that are capable of or facilitate electron trapping.

Where the charge trapping dielectric layer 608 includes ONO layers, for example, one or both of the first 610 and second 650 insulating layers can include one or more silicon-rich silicon dioxide layers, oxygen-rich silicon dioxide layers, thermally grown or deposited oxide layers and/or nitrided oxide layers, for example. The charge trapping layer 612 can similarly include one or more silicon-rich silicon nitride layers or nitrogen-rich silicon nitride layers formed, for example.

In accordance with further examples, the first 610 and second 650 insulating layers can have respective thicknesses of between about 50 Angstroms to about 150 Angstroms, about 60 Angstroms to about 140 Angstroms or about 70 Angstroms to about 130 Angstroms, while the charge trapping nitride layer 612 can have a thickness of between about 20 Angstroms to about 80 Angstroms, about 25 Angstroms to about 75 Angstroms or about 30 Angstroms to about 70 Angstroms.

Figure 14:
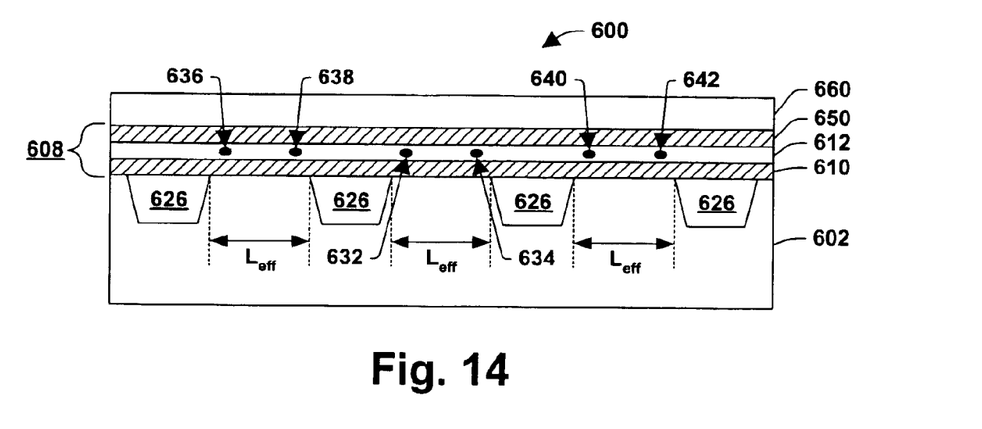
Figure 15:
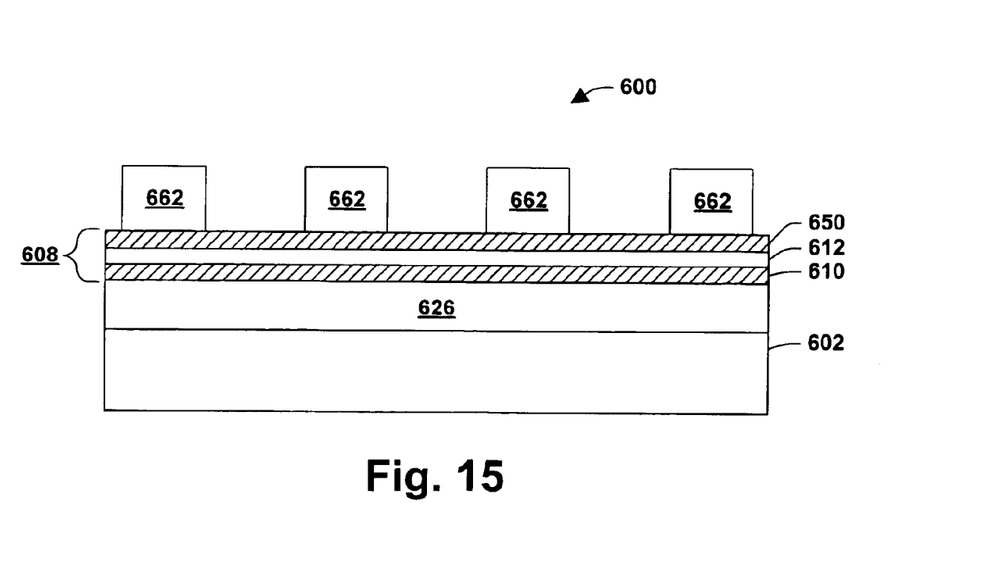

A layer of wordline material 660 is then formed over the second insulating layer 650 (FIG. 14). The wordline material 660 can, for example, include poly-silicon or other type of conductive material. Finally, the wordline material 660 is patterned (e.g., etched) to establish wordlines 662 over the buried bitlines 626 (FIG. 15) to illustrate the plurality of wordlines formed after patterning thereof. It will be appreciated that FIG. 15 may correspond to the device depicted in FIG. 3 taken along lines 15—15. Accordingly, the illustration depicted in FIG. 15 is rotated 90 degrees relative to the images illustrated in FIGS. 6–14. As such, a side view or view along the length of a buried bitline 626 is illustrated in FIG. 15. Also, it will be appreciated that the buried bitlines 626 and the wordlines 662 are oriented at substantially right angles relative to one another.

It will be further appreciated that any of the layers described herein can be formed in any one or more suitable manners, either alone or in combination, such as with spin-coating techniques, spray-on techniques, sputtering techniques (e.g., magnetron or ion beam sputtering), growth and/or deposition techniques, such as chemical vapor deposition (CVD) and/or low pressure chemical vapor deposition (LPCVD), for example.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming at least a portion of a dual bit memory core array upon a semiconductor substrate, the method comprising:

forming a portion of a charge trapping dielectric layer over the substrate;

forming a resist over the portion of the charge trapping dielectric layer;

patterning the resist to form a plurality of resist features having respective first spacings therebetween;

applying Safier material to sidewalls of the resist features;

treating the Safier material so that it becomes attached to sidewalls of the resist features and defines respective second spacings between the resist features that are less than the first spacings;

performing a bitline implant through the second spacings and the portion of the charge trapping dielectric layer to establish buried bitlines within the substrate having respective widths corresponding generally to that of the second spacings;

removing the patterned resist and Safier material;

forming the remainder of the charge trapping dielectric layer over the portion of the charge trapping dielectric layer;

forming a wordline material over the remainder of the charge trapping dielectric layer; and patterning the wordline material to form wordlines that overlie the bitlines.

2. The method of claim 1, wherein treating the Safier material comprises:

baking the Safier material so that the resist and Safier material flow together and the Safier material becomes bonded to the sidewalls of the resist features.

3. The method of claim 1, wherein the first spacing is about 140 nanometers and the second spacing is about 120 nanometers going down to about 50 nanometers for subsequent shrinks.

4. The method of claim 1, wherein forming a portion of a charge trapping dielectric layer comprises:

forming a first insulating layer over the semiconductor substrate; and forming a charge trapping layer over the first insulating layer.

5. The method of claim 4, wherein forming the remainder of the charge trapping dielectric layer comprises:

forming a second insulating layer over the charge trapping layer.

6. The method of claim 5, wherein the first and second insulating layers comprise at least one of one or more silicon-rich silicon dioxide layers, one or more oxygen-rich silicon dioxide layers, one or more thermally grown or deposited oxide layers and one or more nitrided oxide layers.

7. The method of claim 5, wherein the charge trapping layer comprises at least one of one or more silicon-rich silicon nitride layers and one or more nitrogen-rich silicon nitride layers.

8. The method of claim 5, wherein the first insulating layer is formed to a thickness of about 70 Angstroms or less.

9. The method of claim 5, wherein the charge trapping layer is formed to a thickness of between about 60 to 80 Angstroms.

10. The method of claim 5, wherein the second insulating layer is formed to a thickness of about 100 Angstroms or less.

11. The method of claim 1, wherein the bitline implant includes at least one of arsenic, phosphorous and antimony.

12. The method of claim 11, wherein the bitline implant is performed at a concentration of between about 0.75E15 and 2E15 atoms/cm$^3$.

13. The method of claim 12, wherein the bitline implant is performed at an energy level of between about 40 to 70 KeV.

14. The method of claim 1, wherein the wordlines are oriented at substantially right angles relative to the buried bitlines.

15. The method of claim 1, wherein the wordline material includes poly-silicon.

16. The method of claim 1, comprising:

performing a threshold adjustment implant into the semiconductor substrate prior to forming the portion of the charge trapping dielectric layer.

17. The method of claim 16, wherein the substrate is doped with a p-type dopant and the threshold adjustment implant includes a greater concentration of the same or different p-type dopant.

18. The method of claim 17, wherein the threshold adjustment implant includes boron.

19. The method of claim 1, wherein the substrate comprises silicon.

20. The method of claim 1, further comprising:

iteratively applying and treating Safier material added to the resist to incrementally increase respective widths of the resist features.

21. The method of claim 20, wherein a third spacing between resist features is about 90 nanometers after a second application and treatment of Safier material.

22. The method of claim 20, wherein a fourth spacing between resist features is about 50 nanometers after a third application and treatment of Safier material.

23. A method of forming at least a portion of a dual bit memory core array upon a semiconductor substrate, the method comprising:

utilizing a Safier material to narrow bitline openings defined between resist features formed upon a charge trapping layer overlying a first insulating layer overlying the substrate;

forming bitline implants through the openings, charge trapping layer and first insulating layer to establish buried bitlines within the substrate having respective widths corresponding generally to widths of the narrowed bitline openings;

removing the resist features and Safier material;

forming a second insulating layer over the charge trapping layer;

forming a wordline material over the second insulating layer; and patterning the wordline material to form wordlines that overlie the bitlines.

24. The method of claim 23, further comprising:

baking the Safier material so that portions of the Safier material and resist features flow together and the Safier material becomes bonded to sidewalls of the resist features.

25. The method of claim 24, further comprising:

iteratively applying Safier material to sidewalls of the resist features and baking the Safier material to progressively narrow the bitline openings.

26. The method of claim 25, wherein the bitline openings are narrowed by a first amount upon a first application and treatment of the Safier material, a second amount upon a second application and treatment of the Safier material and a third amount upon a third application and treatment of the Safier material.

27. The method of claim 26, wherein the second amount is about twice that of the first amount and the third amount is about three times that of the first amount.

* * * * *